United States Patent
Tawarayama et al.

[11] Patent Number: 5,914,484
[45] Date of Patent: *Jun. 22, 1999

[54] CIRCUIT FOR ADJUSTING LUMINOUS ENERGY OF LIGHT-EMITTING ELEMENT AND OPTICAL DEVICE USING SAME

[75] Inventors: Hideki Tawarayama, Kyoto; Yoshitaka Koharagi, Tosu, both of Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/636,656

[22] Filed: Apr. 23, 1996

[30] Foreign Application Priority Data

Nov. 21, 1995  [JP]  Japan ..................... 7-302503

[51] Int. Cl.[6] ................. G02F 1/01; H01S 3/10
[52] U.S. Cl. .............. 250/205; 250/214 R; 372/29; 372/38
[58] Field of Search .............. 250/205, 214 AG, 250/214 R; 372/38, 31, 29, 33

[56] References Cited

U.S. PATENT DOCUMENTS

| | | | |
|---|---|---|---|
| 4,580,044 | 4/1986 | Hongo et al. | 372/31 |
| 4,618,958 | 10/1986 | Shibata et al. | 372/38 |
| 4,718,068 | 1/1988 | Yoshikawa | 372/38 |
| 4,734,914 | 3/1988 | Yoshikawa | 372/31 |
| 4,745,609 | 5/1988 | Yoshikawa | 372/31 |
| 4,763,334 | 8/1988 | Shimada et al. | 372/38 |
| 4,802,179 | 1/1989 | Negishi | 372/38 |
| 4,853,934 | 8/1989 | Sakurai | 250/205 |
| 4,879,459 | 11/1989 | Negishi | 250/205 |
| 4,907,236 | 3/1990 | Shimada | 372/38 |
| 5,008,888 | 4/1991 | Numata et al. | 372/38 |
| 5,317,578 | 5/1994 | Ogou | 372/31 |

OTHER PUBLICATIONS

Horowitz et al., *The Art of Electronics*, 2nd Ed., 1989, pp. 616–617.

Primary Examiner—Edward P. Westin
Assistant Examiner—John R. Lee
Attorney, Agent, or Firm—Majestic, Parsons, Siebert & Hsue P.C.

[57] ABSTRACT

Luminous energy of a light-emitting element in an optical device is adjusted to a desired level by a light adjusting circuit including a light-receiving element adapted to detect the level of luminous energy of light emitted from the light-emitting element, an up/down counter circuit for counting clock signals up or down according to the level detected by the light-receiving element, and a current adjusting circuit for resetting the current intensity supplied to the light-emitting element according to output data from the up/down counter circuit.

10 Claims, 2 Drawing Sheets

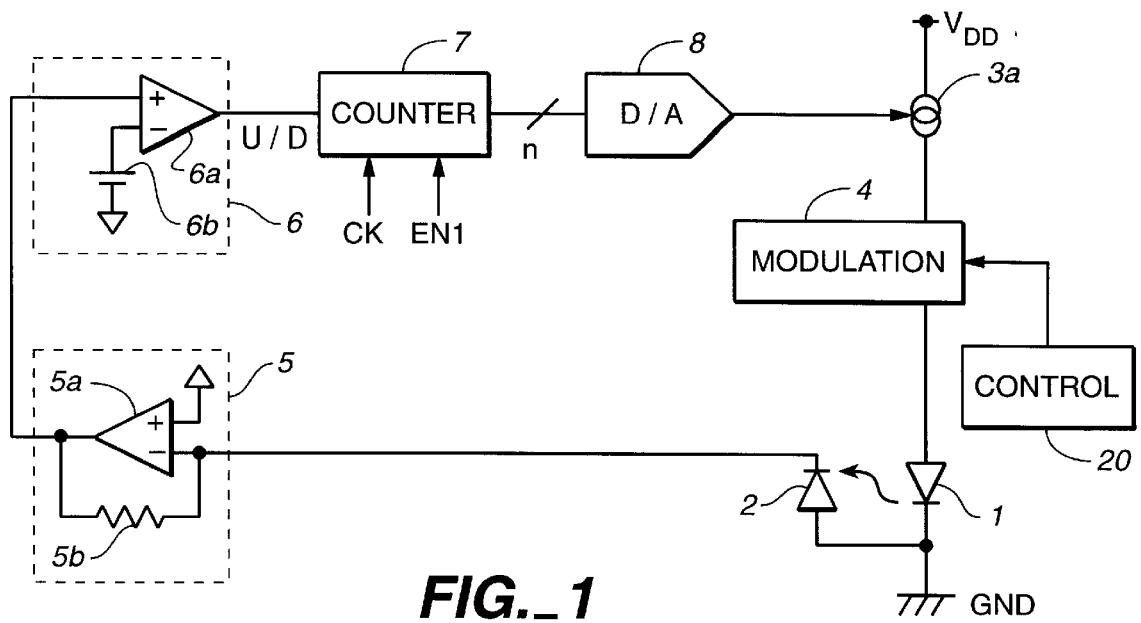
FIG._1
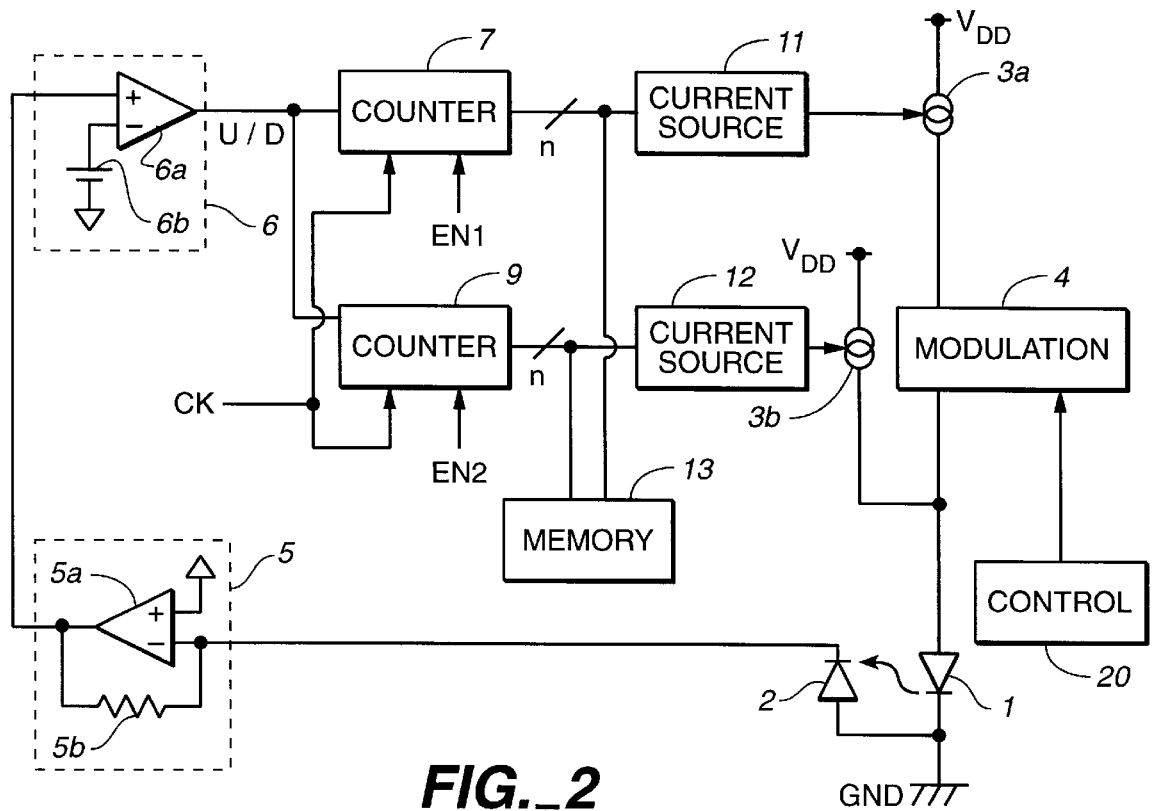
FIG._2

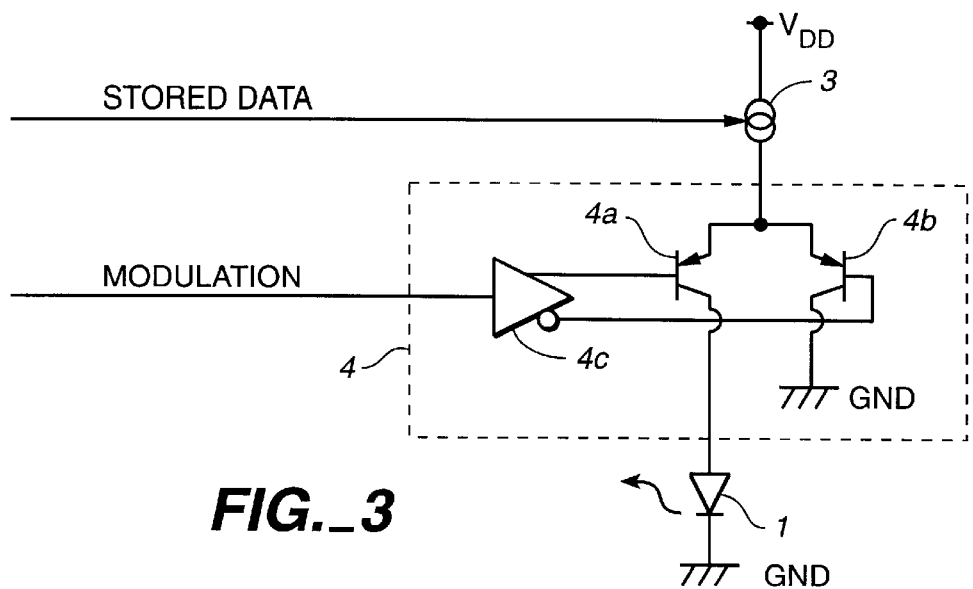
FIG._3
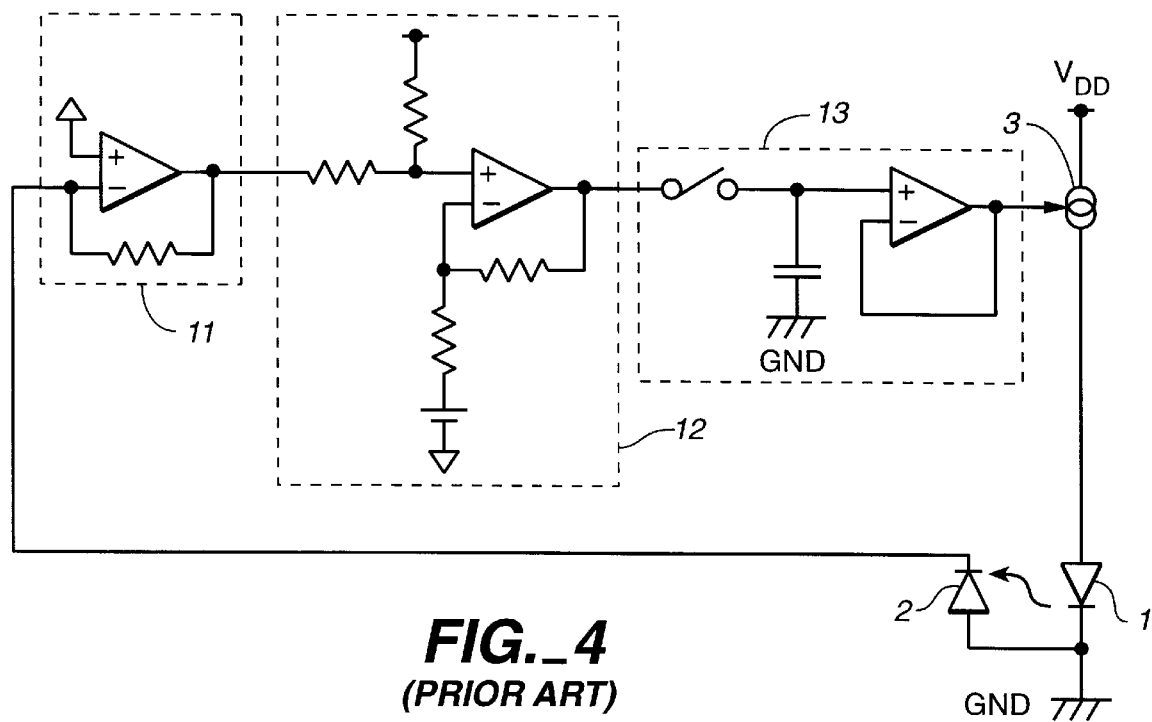
FIG._4
*(PRIOR ART)*

CIRCUIT FOR ADJUSTING LUMINOUS ENERGY OF LIGHT-EMITTING ELEMENT AND OPTICAL DEVICE USING SAME

BACKGROUND OF THE INVENTION

This invention relates to a light adjusting circuit for adjusting the luminous energy (or quantity of light) of a light-emitting element such as a laser diode or a light-emitting diode used in an optical device such as an optical disk device for CD or LD, a laser printer or an optical communication device.

A prior art light adjusting circuit, used in an optical disk device or the like which requires the luminous energy of its light-emitting element such as a laser diode or a light-emitting diode to be kept at a constant level, may be characterized, as shown in FIG. 4, as comprising a constant current source 3 for supplying a current to a light-emitting element 1 such as a light-emitting diode of which the luminous energy is required to remain constant, a light-receiving element 2 such as a photo-diode, a current-to-voltage conversion circuit 11 for converting the current generated in the light-receiving element 2 into a voltage, an amplifier circuit 12 for amplifying the converted voltage and a sample-and-hold circuit 13 for holding an analog voltage at a given time. As the light emitted from the light-emitting element 1 is received by the light-receiving element 2, there is generated an electric current, of which the intensity depends on the luminous energy received thereby. After this current is passed through the conversion circuit 11 to be converted into a voltage and the voltage thus obtained by conversion is amplified by the amplifier 12, this amplified voltage is inputted to the sample-and-hold circuit 13 which serves to sample it at a selected timing and to hold it as an analog voltage value representing the level of luminous energy. At the same time, the current from the constant current source 3 is reset according to the voltage held in the sample-and-hold circuit 13 such that the luminous energy of the light-emitting element 1 will be kept at a constant level.

The light adjusting circuit shown in FIG. 4 is advantageous in that its circuit structure is relatively simple. Because the voltage value in the sample-and-hold circuit 13 is held only as a voltage by a capacitor belonging to the sample-and-hold circuit 13, however, there may arise problems due to the leak current through the switch circuit or the capacitor within the sample-and-hold circuit 13. Because of such a leak current, for example, the voltage held by the sample-and-hold circuit 13 drops gradually (or "drift"), causing the current intensity of the constant current source 3 as well as the luminous energy of the light-emitting diode 1 to change gradually. When the device is operated in a high-temperature environment, in particular, the leak current through the switch circuit increases and the variations in the voltage value held in the sample-and-hold circuit 13 and the luminous energy become even greater. Since the input impedance of the sample-and-hold circuit 13 is high when its switch circuit is opened, there is a further problem that the voltage value held therein is susceptible to sudden changes due to the external noise invading the circuitry.

In view of the problems of the kind described above, it is sometimes necessary, when a prior art light adjusting circuit is used in an optical disk device or the like, to include a program for adjusting the change in luminous energy due to a leak current at several places in the control program for the optical disk device. This makes the control program complicated for the device, and high-speed operations of the device becomes difficult. In order to reduce the variations in the voltage values held in the sample-and-hold circuit due to the leak current through the capacitor, furthermore, it is necessary either to increase the capacitor area on an semiconductor element to thereby increase its capacitance or to attach a capacitor with large capacitance externally. This, however, goes against the general effort to include the light adjusting circuit inside a semiconductor integrated circuit or to reduce the number of externally attached components such that luminous energy can be adjusted easily and inexpensively. Moreover, since the capacitor is discharged and the voltage value being held will change whenever the source voltage is switched off, the information stored before the source is cut off cannot be used when the source is switched on again. This makes it necessary, whenever the source voltage is switched on, to detect the level of luminous energy and to thereby set the voltage to be held. This causes a delay in the operation of the device whenever the source is switched on.

SUMMARY OF THE INVENTION

It is therefore a general object of this invention to overcome the problems of prior art light adjusting circuits described above.

It is more particularly an object of this invention to provide an improved light adjusting circuit capable of easily setting the current intensity which should flow through the light-emitting element for adjusting its luminous energy to its specified level.

It is a further object of this invention to provide such a light adjusting circuit which is not apt to sustain changes with time in the current intensity after it is set.

It is another object of this invention to provide an optical device which uses such a light adjusting circuit and can be easily and inexpensively produced.

A light adjusting circuit according to this invention, with which the above and other objects can be accomplished, may be characterized not only as being adapted to adjust luminous energy of a light-emitting element, which may be incorporated in an optical device, but also as comprising a light-receiving element which detects the level of luminous energy of light emitted from the light-emitting element, an up/down counter circuit for counting clock signals up or down according to the level of luminous energy detected by the light-receiving element, and a current adjusting circuit for resetting intensity of current supplied to the light-emitting element according to output data from the up/down counter circuit. An optical device according to this invention, such as a device for optical data transmission, may be characterized as comprising a light-emitting element coupled with a light adjusting circuit as characterized above and a modulation circuit which receives a modulation signal from a control unit of the device to modulate the constant current to be supplied to the light-emitting element.

With a light adjusting circuit thus structured, the current to be supplied to the light-emitting element can be adjusted easily and its luminous energy can stay constant with time. Optical devices using a light adjusting circuit of this invention are advantageous in that frequent adjustments of the luminous energy of its light-emitting element can be dispensed with.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a light adjusting circuit embodying this invention;

FIG. 2 is a circuit diagram of another light adjusting circuit embodying this invention;

FIG. 3 is a circuit diagram of a modulation circuit which may be used in the circuits shown in FIGS. 1 and 2; and FIG. 4 is a circuit diagram of a prior art light adjusting circuit.

Throughout herein, some of those components which are substantially equivalent or function at least similarly to one another are indicated for convenience by the same symbol, even where they are parts of different circuits, and may not be repetitiously described.

DETAILED DESCRIPTION OF THE INVENTION

The invention is described next by way of examples. FIG. 1 shows a light adjusting circuit according to one embodiment of the invention incorporated in an optical device (also referred to simply as "the system") having a light-emitting element 1 and adapted to carry out optical data transmission by modulating (in a broad sense of the word) the light emission therefrom in response to a modulation signal outputted from the system itself. The light-emitting element 1, of which the luminous energy is required to be kept at a constant level, may be a laser diode or a light-emitting diode. Throughout herein, expression "luminous energy" or "quantity of light" is intended to be interpreted as broadly as possible, including, for example, the brightness in the case of visible light and the intensity in the case of invisible light such as infrared light.

The light adjusting circuit for the light-emitting element 1 includes, as shown in FIG. 1, a constant current source 3a, a modulation circuit 4, a light-receiving element 2, a current-to-voltage conversion circuit 5, a comparator circuit 6, an up/down counter circuit 7 and a digital-to-analog conversion (D/A) circuit 8. The constant current source 3a is for the purpose of supplying an electric current to the light-emitting element 1 to cause it to emit light. The modulation circuit 4 is for modulating the current supplied to the light-emitting element 1. The light-receiving element 2 may include a photo-diode or a photo-transistor for receiving the light emitted from the light-emitting element 1 and converting the received light into a current. The current-to-voltage conversion circuit 5 (with operational amplifier 5a serving as a converter) is for converting the current flowing through the light-receiving element 2 into a voltage. The comparator circuit 6 (with operational amplifier 6a serving as a comparator) is for determining whether or not an input voltage received thereby is larger than a reference voltage. The up/down counter circuit 7 is for counting clock signals in response to a control signal received thereby. The D/A circuit 8 serves as a current adjusting circuit for setting a current intensity for the constant current source 3a. D/A circuits with different output forms may be used for the purpose of this invention.

Explained more in detail, the constant current source 3a, the modulation circuit 4 and the light-emitting element 1 are connected in series between a source voltage ($V_{DD}$) and a reference voltage (GND). The light-receiving element 2 has its anode connected to the reference voltage and its cathode connected to the inversion input of the current-to-voltage conversion circuit 5. The current-to-voltage conversion circuit 5 has its inversion input and output connected to each other with a resistor 5b in between and its output is connected to the noninversion input of the comparator circuit 6. The inversion input of the comparator circuit 6 is connected to a voltage source 6b which provides a comparison voltage. The output of the comparator circuit 6 (signals outputted therefrom being hereinafter referred to as "the U/D signal") is connected to the input of the counter circuit 7 for switching between "up" and "down" counts. The digital output of the counter circuit 7, comprising n lines where n is an arbitrary integer), is connected to the current-adjusting input terminal of the constant current source 3a through the D/A circuit 8. The modulation circuit 4 is adapted to receive a modulation signal from a control circuit 20 of the optical device (or "the system") which incorporates the light-emitting element 1.

To simply describe the operation of the circuits illustrated in FIG. 1, the current, which is generated by the light-receiving element 2 in accordance with the luminous energy emitted from the light-emitting element 1, is passed through the current-to-voltage conversion circuit 5 and is compared with the comparison voltage at the voltage source 6b of the comparator circuit 6. The counter circuit 7 counts up or down clock signals CK in accordance with the U/D signals from the comparator circuit 6 and a control signal EN1, and the digital signal obtained as a result of the counting by the counter circuit 7 is converted into an analog voltage by the D/A circuit 8 and reset the current intensity for the constant current source 3a, thereby maintaining the luminous energy of the light from the light-emitting element 1 at a constant level.

Explained more in detail, the counter circuit 7 is adapted to count up clock signals CK when the control signal EN1 indicates that counting is allowed and the U/D signal from the comparator circuit 6 is high level and to count down when the U/D signal is low level. It is further adapted to reduce the current intensity for the constant current source 3a if the analog voltage obtained by the D/A circuit 8 is higher than a specified value determined by the comparison voltage of the comparator circuit 6 and to increase it if the analog voltage is lower than the specified value.

FIG. 2 shows another light adjusting circuit embodying this invention which is different from the circuit shown in FIG. 1 in that the D/A circuit 8 of FIG. 1 is replaced by another counter circuit 9, which is similar to the counter circuit 7 shown in FIG. 1 and is also connected to the output of the comparator circuit 6, and a pair of current source circuits 11 and 12, which are connected respectively to the output of the counter circuits 7 and 9 to serve as current adjusting means for adjusting a current intensity according to its digital output. The output of the current source circuit 11 is connected to the current adjusting input of the current source 3a, and the output of the current source circuit 12 is connected to the current adjusting input of a constant current source 3b which is connected between the source voltage and the anode of the light-emitting element 1. The digital outputs of both counter circuits 7 and 9 are connected to a memory element 13, such as a so-called "flash", for storing digital data. The clock signals CK are also adapted to be received by the counter circuit 9, and control signal EN2 is similarly received by the counter circuit 9. The current source circuits 11 and 12 are of a circuit structure whereby the total of currents from a plurality of current sources can be varied according to digital outputs such that their total output is connected to the constant current sources 3a and 3b as a current mirror. The memory element 13 may be a nonvolatile read/write memory such as a strong dielectric memory or an EEPROM. The other components shown in FIG. 2 are the same as those shown in FIG. 1 and hence are indicated by the same numerals without being repetitiously explained.

With a circuit structured as shown in FIG. 2, as with the circuit shown in FIG. 1, not only is it possible to easily set the current to be passed through the light-emitting element 1, but also to provide a luminous energy adjusting circuit without a change in luminous energy with time. If necessary, different target current intensities can be set and stored in the memory element 13 as digital data. This makes it possible, for example, to immediately set the current intensities for the constant current sources 3a and 3b when power is switched on, without preliminarily carrying out detection of luminous energy for initialization, by using memory data which were stored earlier or set by the maker. As a result, a quick start-up becomes possible for apparatus such as an optical disk device or a laser printer.

The circuit arrangement of FIG. 2 can be used also as follows for setting the luminous energy of the light-emitting element 1 in two levels. First, control signals EN1 and EN2 are set so as to respectively inhibit and allow the counting by the counter circuits 7 and 9, and the counter circuit 9 is used to determine the current intensity for the constant current source 3b. The luminous energy of the light-emitting element 1 in this situation is referred to as the first level. Next, the voltage at the voltage source 6b is changed and the control signals EN1 and EN2 are set so as to respectively allow and inhibit the counting by the counter circuits 7 and 9. The current from the constant current source 3a is determined, and the luminous energy of the light-emitting element 1 in this situation is now referred to as the second level. If the circuit assembly of FIG. 2 is operated thereafter by setting both control signals EN1 and EN2 so as to inhibit the counting by the counter circuits 7 and 9, the current through each of the constant current sources and the luminous energy of the light-emitting element 1 corresponding to each current intensity can be maintained at a constant level. If the voltage source 6b is set then such that the current intensity for the constant current source 3a is greater than that for the constant current source 3b, light emission will be at a low level (low brightness) when current is supplied to the light-emitting element 1 only from the constant current source 3b but it will be at a high level (high brightness) if the current to the light-emitting element 1 is supplied from both constant current sources 3a and 3b. In other words, data output in two levels of brightness can be effected on the basis of a modulation signal. According to a preferred embodiment of the invention, outputs from each of the counter circuits can be stored in or read from the memory element 13, whenever necessary, such that the intensities of currents from the current source circuits 11 and 12 can be set on the basis of data from the memory element 13, rather than from the outputs of the counter circuits 7 and 9.

FIG. 3 shows an example of modulation circuit 4 together with a driver circuit for the light-emitting element 1 using the same. The modulation circuit 4 is connected between a constant current source 3 and a light-emitting element 1 which are connected in series between a source voltage ($V_{DD}$) and a reference voltage (GND) and comprises a first pnp-type transistor 4a serving as a switch between the constant current source 3 and the light-emitting element 1, a second pnp-type transistor 4b serving as another switch between the constant current source 3 and the reference voltage, and an output circuit 4c for switching the transistors 4a and 4b on and off between conducting and non-conducting states in a mutually opposite manner. The output circuit 4c has an input connected to a control circuit (not shown) from which a modulation signal is received and inversion and noninversion outputs which are individually connected to the bases of the transistors 4a and 4b. With the modulation circuit 4 thus formed, the current from the constant current source 3 is guided to the light-emitting element 1 to switch it on or to the reference voltage to switch it off, depending on the modulation signal.

This invention has been described above with reference to only a limited number of examples, but these examples are not intended to limit the scope of the invention. Many modifications and variations are possible within the scope of this invention. For example, circuit elements shown in FIGS. 1 and 2 may be variously combined, and additional counter circuits, current source circuits and constant current sources may be introduced such that light emission in more brightness levels can be effected. The current-to-voltage circuit 5 and the comparator circuit 6 may be formed differently, and the current-to-voltage circuit 5 may even be omitted. The invention is also applicable to optical devices with a plurality of light-emitting elements. The modulation circuit 4 need not be formed exactly as described with reference to FIG. 3. Any other circuit capable of modulate the current through the light-emitting element can be substituted.

In summary, the present invention provides a light adjusting circuit capable of easily setting the current to pass the light-emitting element. Since the current intensity which is set and the corresponding luminous energy of the light-emitting element are not subjected to change with time, the luminous energy is stable and adjustments are not required as frequently as before. With the embodiment of the invention shown in FIG. 2, furthermore, the current to be provided to the light-emitting element can be modulated by faster data because adjustments of luminous energy need not be carried out frequently during a system operation. As a result, high-speed operation of optical devices and high-density optical devices become possible.

What is claimed is:

1. A light adjusting circuit for adjusting luminous energy of a light-emitting element; said light adjusting circuit comprising:

a light-receiving element which detects level of luminous energy of light emitted from said light-emitting element;

a plurality of up/down counter circuits each for counting clock signals up or down according to said detected level of luminous energy, a memory device connected to receive and store data outputted from said counter circuits; and a plurality of current adjusting circuits each for selecting one of a plurality of current intensity values according to data received from said memory device and supplying a current with said selected current intensity value through an associated one of a plurality of constant current sources to said light-emitting element.

2. The light adjusting circuit of claim 1 further comprising:

a current-to-voltage conversion circuit for converting current received from said light-receiving element into a voltage; and a comparator circuit for comparing said voltage outputted from said current-to-voltage conversion circuit with a reference voltage and accordingly causing said up/down counter circuits to count clock signals up or down.

3. The light adjusting circuit of claim 2 wherein said memory device comprises a non-volatile read/write memory device.

4. The light adjusting circuit of claim 1 wherein said memory device comprises a non-volatile read/write memory device.

5. An optical device comprising:

a light-emitting element;

a light-receiving element which detects level of luminous energy of light emitted from said light-emitting element;

a plurality of up/down counter circuits each for counting clock signal up or down according to said detected level of luminous energy;

a memory device connected to receive and store data outputted from said counter circuits; and a plurality of current adjusting circuits each for selecting one of a plurality of current intensity values according to data received from said memory device and supplying a current with said selected current intensity value through an associated one of a plurality of constant current sources to said light-emitting element, whereby current passed through said light-emitting element is adjusted.

6. The optical device of claim 5 further comprising:

a control circuit for outputting a modulation signal; and a modulation circuit connected between one of said constant current sources and said light-emitting element and adapted to receive said modulation signal to thereby modulate said current supplied to said light-emitting element.

7. The optical device of claim 6 further comprising:

a current-to-voltage conversion circuit for converting current received from said light-receiving element into a voltage; and a comparator circuit for comparing said voltage outputted from said current-to-voltage conversion circuit with a reference voltage and accordingly causing said up/down counter circuits to count clock signals up or down.

8. The optical device of claim 6 wherein said memory device comprises a non-volatile read/write memory device.

9. The optical device of claim 6 wherein said modulation circuit comprises:

a first transistor serving as a switch between said one constant current source and said light-emitting element;

a second transistor serving as a switch between said one constant current source and a reference voltage; and an output circuit with an input for receiving said modulation signal therethrough, an inversion output and a noninversion output, either of said outputs being connected to the base of said first transistor and the other of said outputs being connected to the base of said second transistor.

10. The optical device of claim 5 wherein said memory device comprises a non-volatile read/write memory device.

* * * * *